(12) United States Patent
Bartlett

(10) Patent No.: US 11,041,880 B2
(45) Date of Patent: Jun. 22, 2021

(54) CONTACTLESS COUPLING BETWEEN TEST AND MEASUREMENT SYSTEM AND A DEVICE UNDER TEST

(71) Applicant: Tektronix, Inc., Beaverton, OR (US)

(72) Inventor: Josiah A. Bartlett, Forest Grove, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 16/162,354

(22) Filed: Oct. 16, 2018

(65) Prior Publication Data

US 2019/0170790 A1 Jun. 6, 2019

Related U.S. Application Data

(60) Provisional application No. 62/593,859, filed on Dec. 1, 2017.

(51) Int. Cl.
*G01R 1/04* (2006.01)
*G01R 31/303* (2006.01)
(Continued)

(52) U.S. Cl.
CPC ........ *G01R 1/0416* (2013.01); *G01R 1/06711* (2013.01); *G01R 1/07* (2013.01);
(Continued)

(58) Field of Classification Search
CPC .. G01R 1/0416; G01R 31/2844; G01R 27/32; G01R 1/07; G01R 1/06711;
(Continued)

(56) References Cited

U.S. PATENT DOCUMENTS 4,965,514 A * 10/1990 Herrick .............. G01R 1/06772
324/754.06
6,452,379 B1 * 9/2002 Cartier .............. G01R 1/06772
324/755.02
(Continued)

FOREIGN PATENT DOCUMENTS

EP 0596773 5/1994
EP 2930523 10/2015

OTHER PUBLICATIONS

European Patent Office, Extended European Search Report and Written Opinion for European Application 18208974.8, dated May 8, 2019, 10 pages, Munich, Germany.
(Continued)

*Primary Examiner* — Vinh P Nguyen
(74) *Attorney, Agent, or Firm* — Miller Nash Graham & Dunn; Andrew J. Harrington

(57) ABSTRACT

A test and measurement probe coupler that may include a substrate, a first signal tap conductor, a first signal contact, a first ground tap conductor, and a first ground contact. The first signal tap conductor may extends a first length along the substrate. The first signal contact may be electrically coupled to the first signal tap conductor, and the first ground tap conductor may extend a second length along the substrate. The first ground tap conductor may be substantially parallel to the first signal tap conductor. The first ground tap conductor may be disposed in a first lateral direction away from the first signal tap conductor, and the first ground contact electrically may be coupled to the first ground tap conductor.

20 Claims, 9 Drawing Sheets

(51) Int. Cl.
*G01R 1/07* (2006.01)
*G01R 1/067* (2006.01)
G01R 1/073 (2006.01)
G01R 27/32 (2006.01)
G01R 31/28 (2006.01)

(52) U.S. Cl.
CPC ........ *G01R 31/303* (2013.01); *G01R 1/07378* (2013.01); *G01R 27/32* (2013.01); *G01R 31/2808* (2013.01); *G01R 31/2844* (2013.01)

(58) Field of Classification Search
CPC .............. G01R 1/07378; G01R 31/303; G01R 31/2808; G01R 31/66; G01R 11/00; G01R 31/302; G01R 31/304; G01R 31/306; H01L 2924/19032
See application file for complete search history.

(56) References Cited

U.S. PATENT DOCUMENTS

| | | | | |
|---|---|---|---|---|
| 7,042,236 | B1* | 5/2006 | Wollitzer | G01R 1/06772 324/755.02 |
| 7,427,868 | B2* | 9/2008 | Strid | G01R 1/06772 324/755.03 |
| 7,466,157 | B2* | 12/2008 | Miller | G01R 1/0491 257/48 |
| 8,076,989 | B2 | 12/2011 | Peschke et al. | |
| 8,587,335 | B2* | 11/2013 | Gregg | G01R 31/2822 324/756.06 |
| 8,798,953 | B2* | 8/2014 | Huang | G01R 27/32 324/601 |
| 8,963,570 | B2* | 2/2015 | Zelder | G01R 1/07 324/755.02 |
| 9,157,930 | B2* | 10/2015 | Nickel | G01R 1/06772 |
| 2004/0000965 | A1 | 1/2004 | Usami et al. | |
| 2005/0174131 | A1 | 8/2005 | Miller | |
| 2015/0276805 | A1* | 10/2015 | Slupsky | G01R 1/07385 324/755.05 |

OTHER PUBLICATIONS

Rosenberger Hochfrequenztechnik Gmbh & Co. KG, Calibrated time domain RF probing of absolute voltages and currents, presentation, Oct. 11, 2016, 39 pages, Fridolfing, Germany.

Rosenberger Hochfrequenztechnik Gmbh & Co. KG, Differential- and Common Mode Directional Probe (DCDP) for 100 Mbps (OABR) and 1 Gbps (802.3bp) Automotive Ethernet, 2015, 12 pages, Fridolfing, Germany.

* cited by examiner

CONTACTLESS COUPLING BETWEEN TEST AND MEASUREMENT SYSTEM AND A DEVICE UNDER TEST

CROSS-REFERENCES TO RELATED APPLICATIONS

This patent application claims the benefit of provisional Application No. 62/593,859 filed Dec. 1, 2017, which is incorporated in this patent application by this reference.

FIELD OF THE INVENTION

This disclosure relates to test and measurement systems, and more particularly to probes for test and measurement systems.

BACKGROUND

Users of test and measurement instruments, such as oscilloscopes, often use probes to connect a device-under-test (DUT), such as a circuit board, to an input of a test and measurement instrument to visualize and perform measurements of electrical signals occurring in the DUT. Often, a user establishes an electrical connection between a probe and a test point on a DUT by making physical contact between a conductive tip of the probe and a conductive test point, for example a gold plated pad, or a plated via in a circuit board. However, other times there is a need to probe a signal travelling through a portion of a DUT that does not have a conductive test point to access, for example a circuit board trace that is covered by a solder mask.

Embodiments of the disclosed systems and methods address shortcomings in the prior art.

DETAILED DESCRIPTION

As described herein, embodiments of the disclosed technology enable the capturing, such as by probing, of high-speed signals traveling along a structure, such as a printed circuit board (PCB) or hybrid integrated circuit, in a device-under-test (DUT) without physically contacting or breaking the signal path. To do so, embodiments of the disclosed technology include a probe coupler that can be used as half of a directional coupler, the other half being a target trace in the DUT. While some conventional systems utilize directional couplers to determine the voltage and current of a signal propagating in a transmission channel, those systems require either breaking the signal path to insert a coupler, or building the coupler(s) into the channel of the DUT. In addition, embodiments of the disclosed technology include methods to correlate or calibrate the signal in the target trace of the DUT to the signal in the probe coupler.

Figure 1:
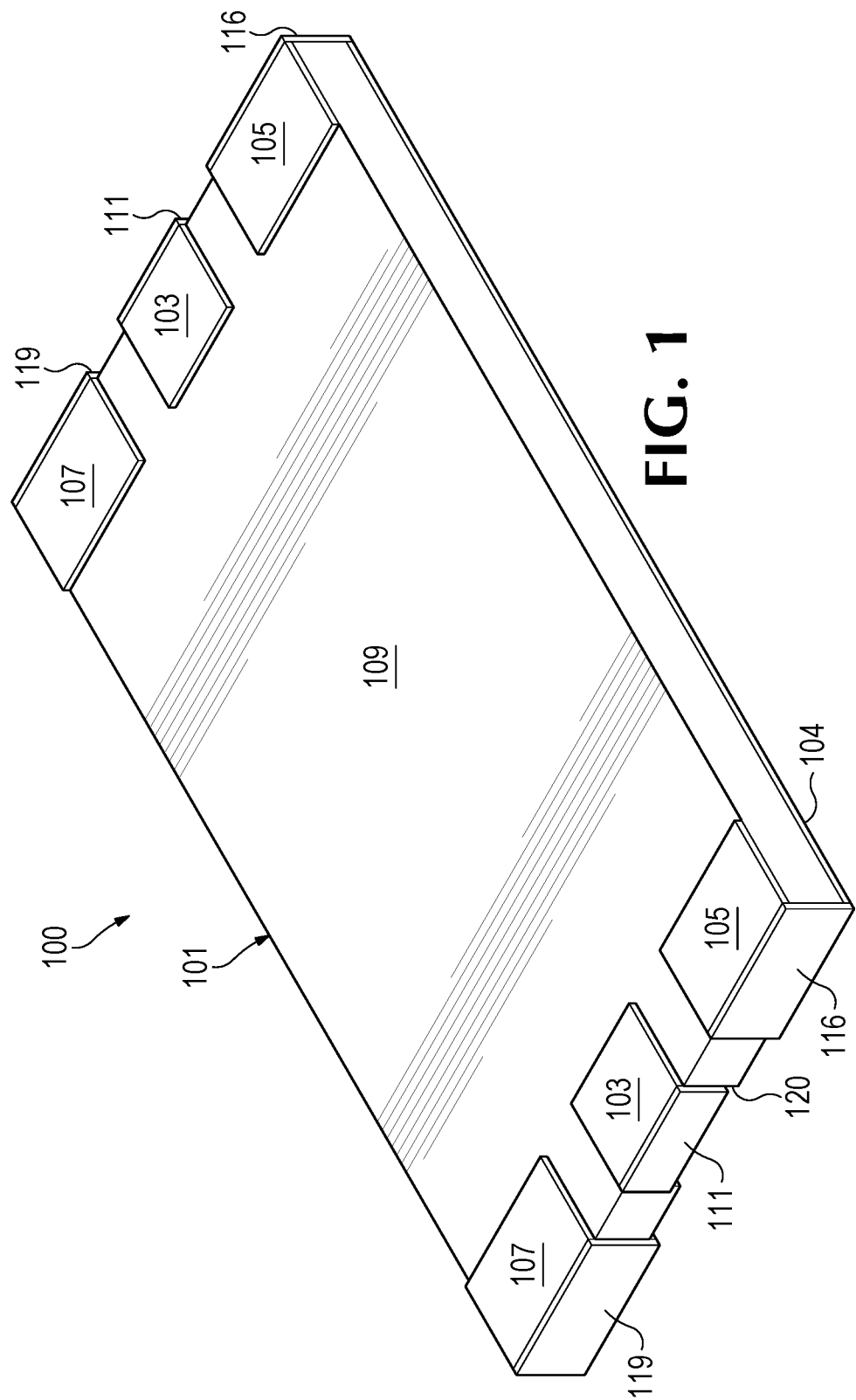
FIG. 1 is an isometric view showing portions of a top- or probe-side of a test and measurement probe coupler, according to embodiments.
Figure 2:
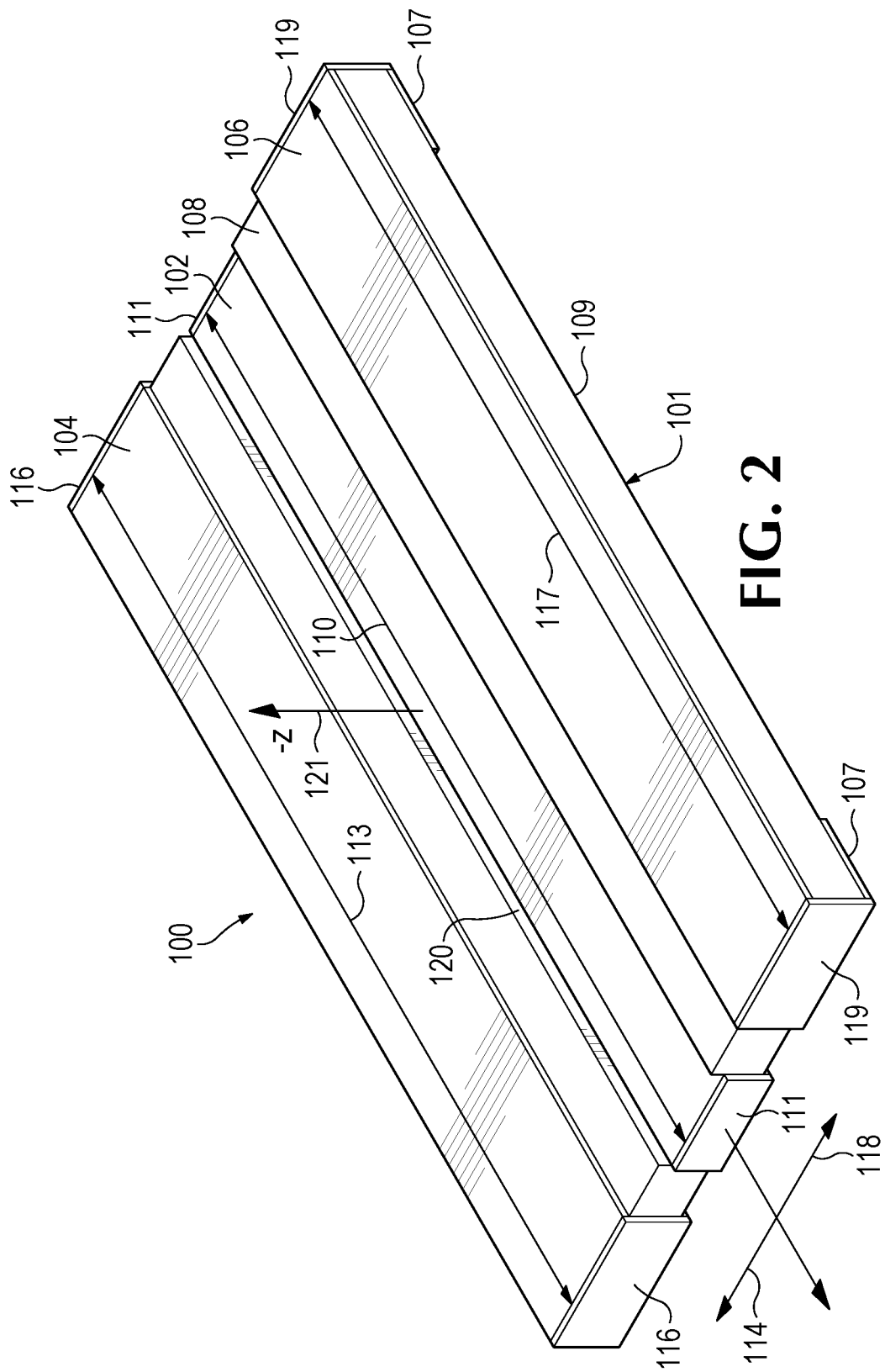
FIG. 2 is an isometric view showing portions of a bottom- or DUT-side of the probe coupler of FIG. 1.

FIG. 1 is an isometric view showing portions of a top- or probe-side of a test and measurement probe coupler, according to embodiments. FIG. 2 is an isometric view showing portions of a bottom- or DUT-side of the probe coupler of FIG. 1. As illustrated in FIGS. 1 and 2, a probe coupler 100 may include a substrate 101, a first signal tap conductor 102, a first signal contact 103, a first ground tap conductor 104, a first ground contact 105, a second ground tap conductor 106, and a second ground contact 107. The probe coupler 100 is configured to be placed over the DUT's trace to be measured, as described below.

The substrate 101 may have a first side 108 and a second side 109 that is opposite the first side 108. The first side 108 may be the bottom- or DUT-side, while the second side 109 may be the top- or probe-side. The substrate 101 may be, for example, substantially planar. The substrate 101 may include, for example, a ceramic thick-film structure. As used in this disclosure, "substantially planar" means largely or essentially planar without requiring perfect planarity.

The first signal tap conductor 102 extends a first length 110 along the substrate 101, for example, along the first side 108 of the substrate 101. As illustrated, the first length 110 may be the length of the substrate 101 in the direction of the first signal tap conductor 102. The first signal tap conductor 102 may be coated with an insulative film, or with a partially conductive film. The first signal tap conductor 102 is configured to couple to a signal of interest in the DUT, such as the signal carried by a target trace 122 of a PCB 128 (see FIG. 3). The first signal contact 103 may be on the second side 109 of the substrate 101 and is electrically coupled to the first signal tap conductor 102. The first signal contact 103 may include a signal contact plate, such as illustrated in FIG. 1, though other configurations might also be used for the first signal contact 103.

In embodiments, the first signal tap conductor 102 may extend around an edge of the substrate 101, forming a conductive endcap 111 to physically connect to the first signal contact 103. In embodiments, the first signal tap conductor 102 may extend around a second edge of the substrate 101, the second edge opposite the first edge, forming another conductive endcap 111 to physically connect to another first signal contact 103, as illustrated in FIG. 1. In embodiments, a via 112 (see FIGS. 7-8) may extend through the substrate 101 and electrically couple the first signal tap conductor 102 to the first signal contact 103.

The first ground tap conductor 104 extends a second length 113 along the substrate 101, for example, along the first side 108 of the substrate 101. As illustrated, the second length 113 may be the length of the substrate 101 in the direction of the first ground tap conductor 104. The first ground tap conductor 104 may be substantially parallel to the first signal tap conductor 102 and disposed in a first lateral direction 114 away from the first signal tap conductor 102. As used in this disclosure, "substantially parallel" means largely or essentially equidistant at all points, without requiring perfect parallelism. An example of this configuration is shown in FIG. 2. The first ground contact 105 may be on the second side 109 of the substrate 101 and is electrically coupled to the first ground tap conductor 104. The first ground tap conductor 104 is configured to couple to the ground of the DUT, such as a ground plane 115 of a PCB 128 (see FIG. 3). The first ground contact 105 may be or include a ground contact plate, such as illustrated in FIG. 1, though other configurations might also be used for the first ground contact 105.

In embodiments, the first ground tap conductor 104 may extend around an edge of the substrate 101, forming a conductive endcap 116 to physically connect to the first ground contact 105. In embodiments, the first ground tap conductor 104 may extend around a second edge of the substrate 101, the second edge opposite the first edge, forming another conductive endcap 116 to physically connect to another first ground contact 105, as illustrated in FIG. 1. In embodiments, a via 112 (see FIGS. 7-8) may extend through the substrate 101 and electrically couple the first ground tap conductor 104 to the first ground contact 105.

The second ground tap conductor 106 extends a third length 117 along the substrate 101, for example, along the first side 108 of the substrate 101. As illustrated, the third length 117 may be the length of the substrate 101 in the direction of the second ground tap conductor 106. The second ground tap conductor 106 may be substantially parallel to the first signal tap conductor 102 and disposed in a second lateral direction 118 away from the first signal tap conductor 102. The second lateral direction 118 of the first signal tap conductor 102 is opposite to the first lateral direction 114 of the first signal tap conductor 102. An example of this configuration is shown in FIG. 2. For example, as illustrated in FIG. 2, the first lateral direction 114 may be to the left of the first signal tap conductor 102, and the second lateral direction 118 may be to the right of the first signal tap conductor 102. "Left" and "right" are used for convenience and in reference to the view provided in FIG. 2. But the disclosed technology may have a number of orientations in actual use.

The second ground contact 107 may be on the second side 109 of the substrate 101 and is electrically coupled to the second ground tap conductor 106. The second ground contact 107 is configured to couple the ground of the probe coupler 100 to the ground of the DUT, such as the ground plane 115 of the PCB (see FIG. 3). The second ground contact 107 may include a ground contact plate, such as illustrated in FIG. 1, though other configurations might also be used for the second ground contact 107.

In embodiments, the second ground tap conductor 106 may extend around an edge of the substrate 101, forming a conductive endcap 119 to physically connect to the second ground contact 107. In embodiments, the second ground tap conductor 106 may extend around a second edge of the substrate 101, the second edge opposite the first edge, forming another conductive endcap 119 to physically connect to another second ground contact 107, as illustrated in FIG. 1. In embodiments, a via 112 (see FIGS. 7-8) may extend through the substrate 101 and electrically couple the second ground tap conductor 106 to the second ground contact 107.

Figure 3:
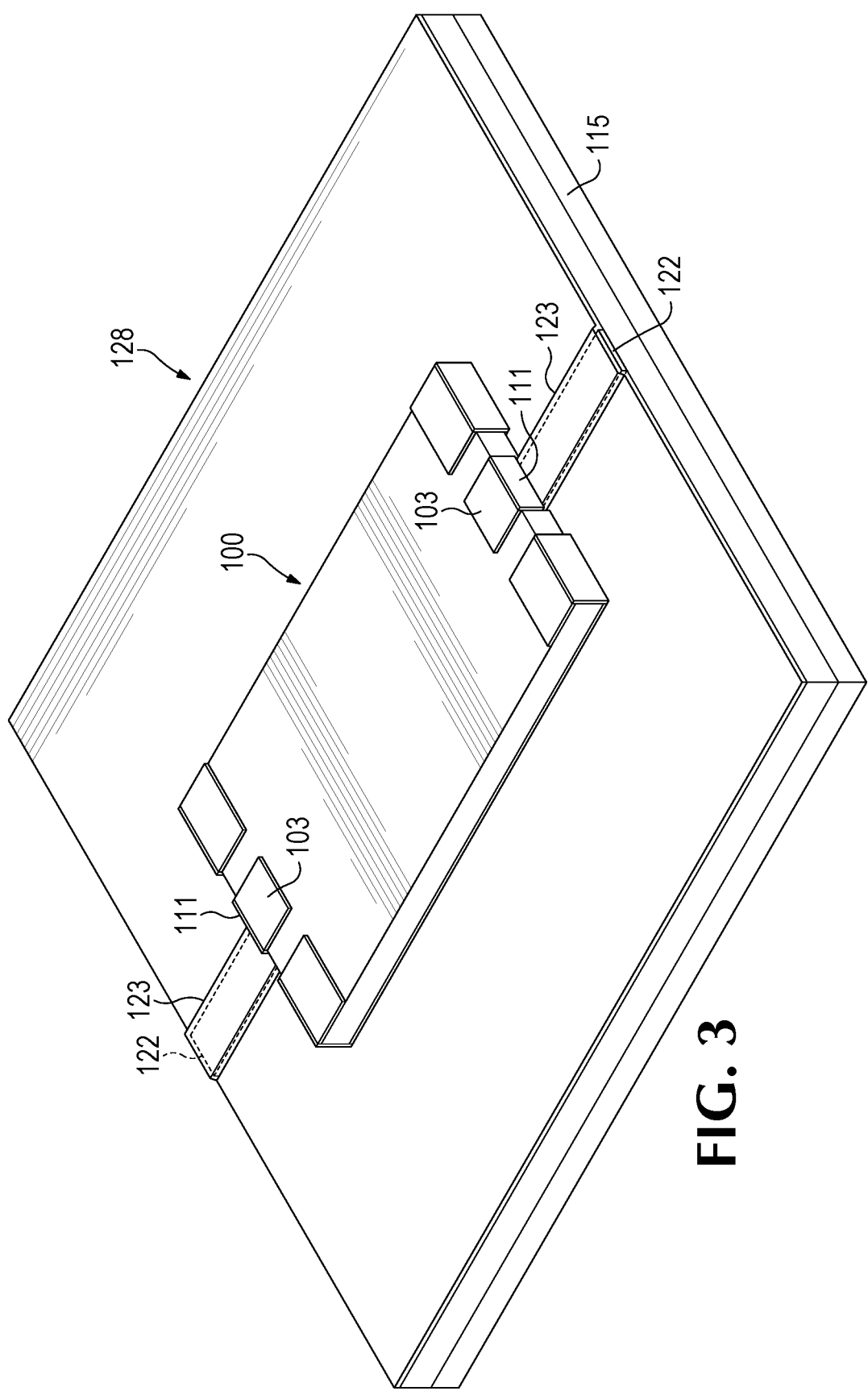
FIG. 3 is an isometric view showing the probe coupler of FIG. 1 on a target trace of an example, simplified DUT.

In embodiments, the substrate 101 may include a channel 120, for example, a channel 120 in the first side 108 of the substrate 101. An example is illustrated in FIG. 2. Accordingly, the first length 110 of the first signal tap conductor 102 may be within the channel 120. The depth of the channel 120 in the minus z direction 121 (perpendicular to the first side 108 of the substrate 101) may be greater than the thickness of the first signal tap conductor 102 in the minus z direction 121. Consequently, the first signal tap conductor 102 may be recessed below the surface of the first side 108 of the substrate 101. When the first signal tap conductor 102 is recessed below the surface of the first side 108 of the substrate 101, the recess may be deep enough to accommodate the target trace 122 of the DUT, as illustrated in FIG. 3. In other embodiments, rather than having the first signal tap conductor 102 located within the channel 102, the target trace 122 of the DUT may instead be accommodated under the first signal tap conductor 102 by increasing the thickness of the first ground tap conductor 105 and/or the second ground tap conductor 106, and/or increasing the thickness of the portion of the substrate upon which the first and second ground tap conductors 105, 106 are disposed, to be greater than the thickness of the target trace 122.

FIG. 3 is an isometric view showing the probe coupler 100 of FIG. 1 on a target trace 122 of a simplified DUT 128. As illustrated, the target trace 122 may be an 8 mil wide trace that is 5 mils above a ground plane 115 of the DUT 128, though other configurations may also be used. For example, the ground plane 115 may comprise multiple ground planes disposed parallel to, and coplanar with, the target trace 122. The target trace 122 may also be covered by film or solder mask 123, such as a polyamide solder mask. As noted above, the DUT 128 may be or include a PCB or hybrid integrated circuit.

Figure 4:
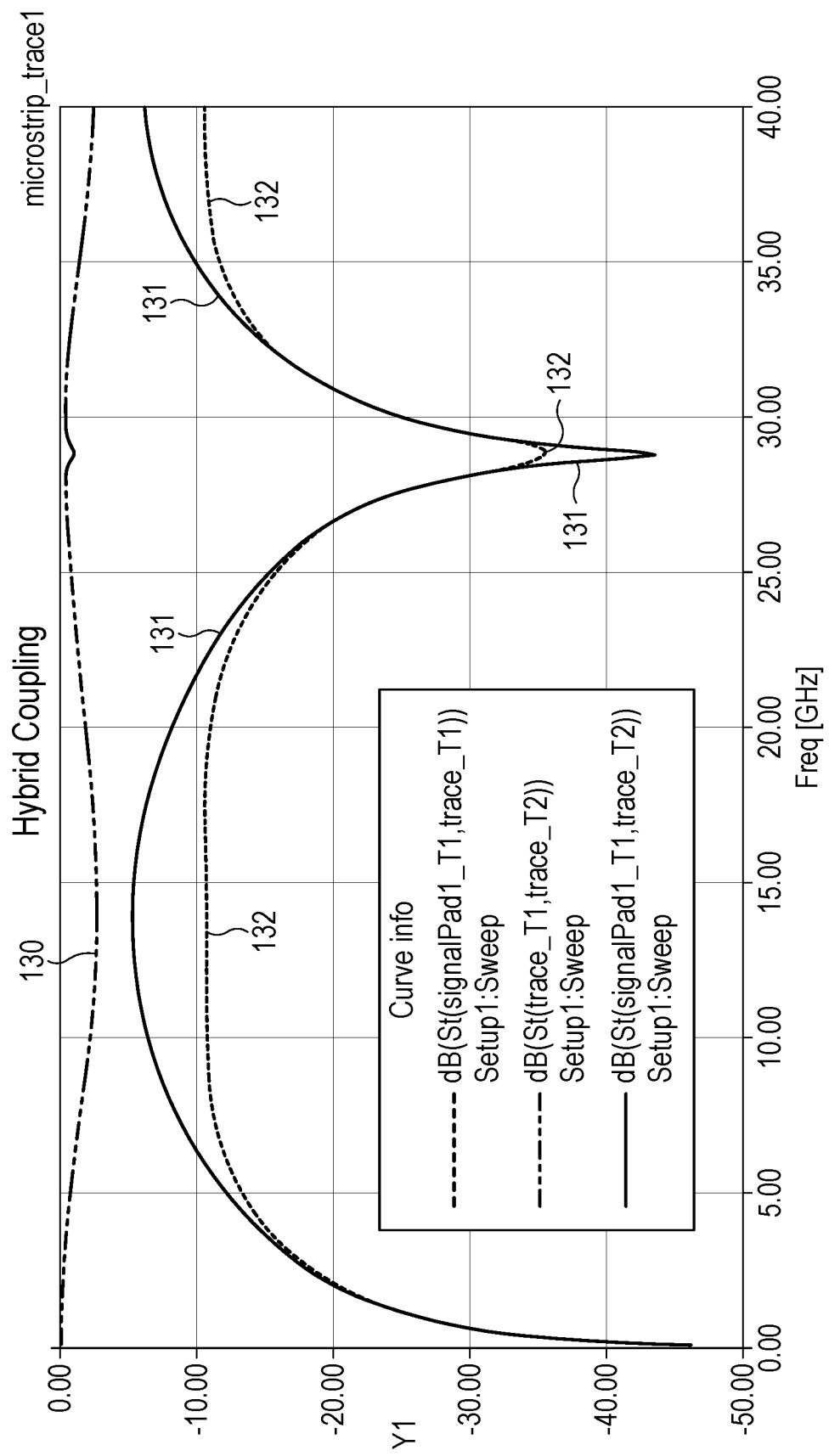
FIG. 4 shows an example of the coupling between the DUT and the probe coupler as arranged in FIG. 3.

FIG. 4 shows an example of the coupling between the DUT 128 and the probe coupler 100 as arranged in FIG. 3. The curve 130 labeled "dB(St(trace_T1,trace_T2))" is the insertion loss of the trace after placing the probe coupler 100 on the DUT, or PCB, 128. The curve 131 labeled "dB(St(signalPad_T1,trace_T2))" is the energy coupled between the trace port 2 and the probe signal pad port 1. The curve 132 labeled "dB(St(signalPad_T1,trace_T1))" is the energy coupled between the trace port 1 and the probe signal pad port 1.

Figure 5:
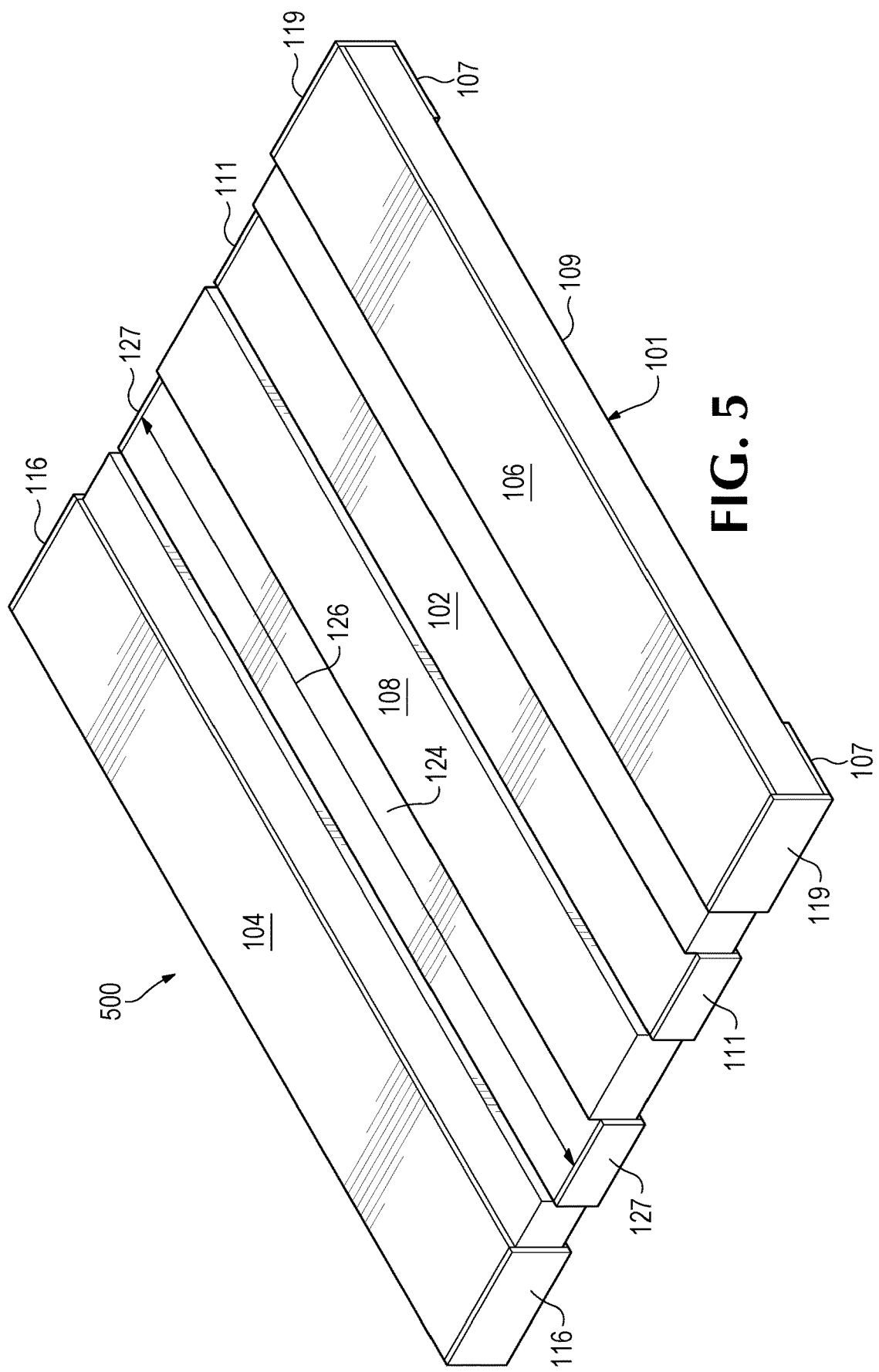
FIG. 5 is an isometric view showing portions of a bottom- or DUT-side of a test and measurement probe coupler, according to embodiments.
Figure 6:
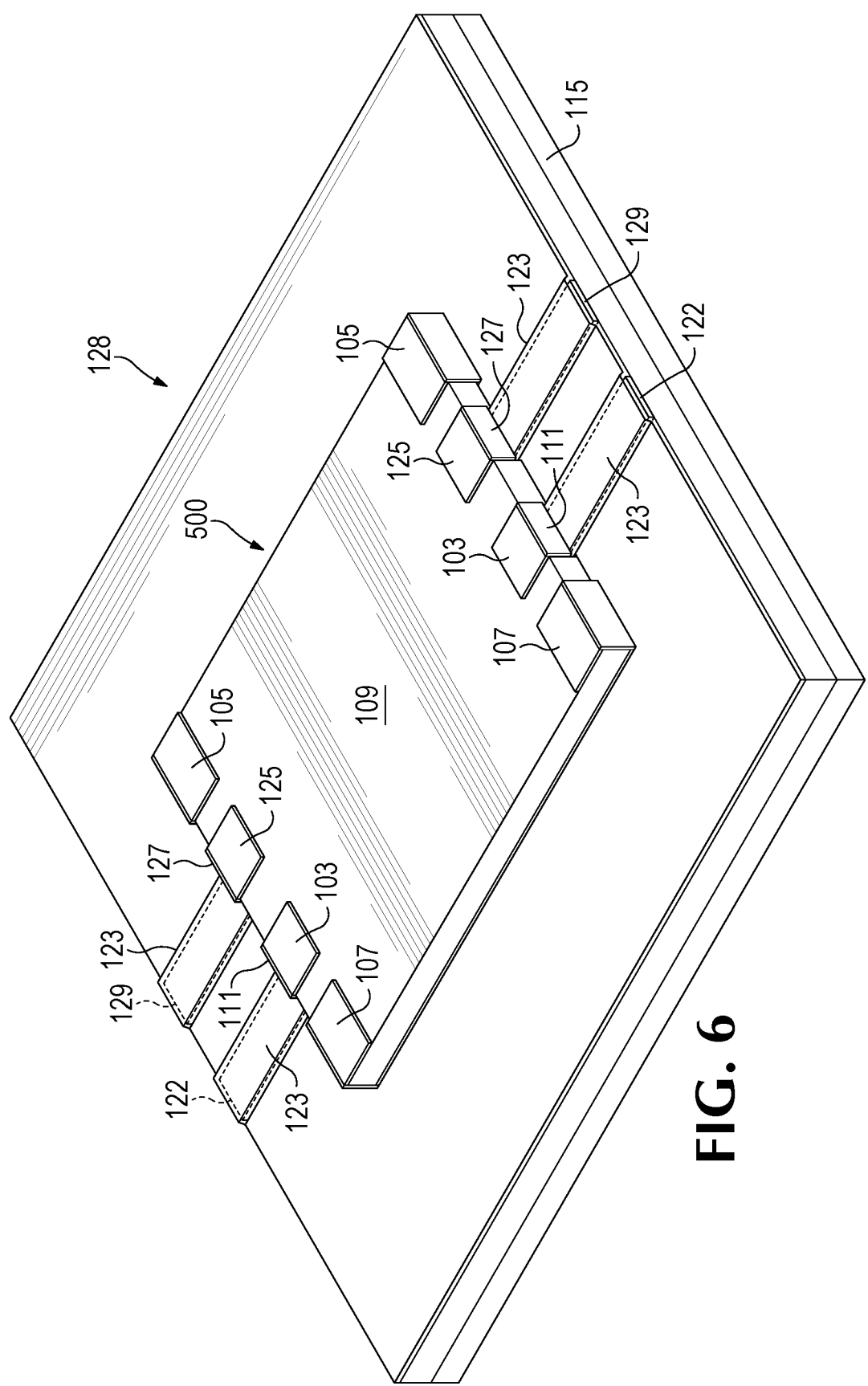
FIG. 6 is an isometric view showing the probe coupler of FIG. 4 on a pair of target traces of an example, simplified DUT.

FIG. 5 is an isometric view showing portions of a bottom- or DUT-side of a test and measurement probe coupler, according to embodiments. FIG. 6 is an isometric view showing the probe coupler of FIG. 5 on a pair of target traces 122, 129 of a simplified DUT 128. The probe coupler 500 of FIGS. 5 and 6 is identical to the probe coupler 100 of FIGS. 1 and 2 except as noted here. Accordingly, the probe coupler 500 may include a substrate 101, a first signal tap conductor 102, a first signal contact 103, a first ground tap conductor 104, a first ground contact 105, a second ground tap conductor 106, and a second ground contact 107. Each of these are as described above for FIGS. 1 and 2. As illustrated in FIGS. 5 and 6, the probe coupler 500 may also include a second signal tap conductor 124 and a second signal contact 125.

The second signal tap conductor 124 extends a fourth length 126 along the substrate 101, for example along the first side 108 of the substrate 101. As illustrated, the fourth length 126 may be the length of the substrate 101 in the direction of the second signal tap conductor 124. The second signal tap conductor 124 may be substantially parallel to the first signal tap conductor 102 and may be between the first signal tap conductor 102 and the first ground tap conductor 104. The second signal tap conductor 124 may be coated with an insulative or partially conductive film. The second signal tap conductor 124 may be configured to couple to a second signal of interest in the DUT, such as the signal carried by a second target trace 129 of the PCB 128. Alternatively, the first signal tap conductor 102 and the second signal tap conductor 124 may be configured together to couple to a differential signal of interest that may be carried together by target traces 122 and 129. The second signal contact 125 may be on the second side 109 of the substrate 101 and is electrically coupled to the second signal tap conductor 124. The second signal contact 125 may include a signal contact plate, such as illustrated in FIG. 6, though other configurations might also be used for the second signal contact 125.

In embodiments, the second signal tap conductor 124 may extend around an edge of the substrate 101, forming a conductive endcap 127 to physically connect to the second signal contact 125. In embodiments, the second signal tap conductor 124 may extend around a second edge of the substrate 101, the second edge opposite the first edge, forming another conductive endcap 127 to physically connect to another second signal contact 125, as illustrated in FIG. 6. In embodiments, a via 112 (see FIGS. 7-8) may extend through the substrate 101 and electrically couple the second signal tap conductor 124 to the second signal contact 125.

Accordingly, the probe coupler 500 of FIGS. 5 and 6 may be used to take differential measurements or to measure multiple traces on a DUT. Since the target trace 122 is broadside-coupled to its corresponding signal tap conductor (the first signal tap conductor 102 in the example of FIGS. 5-6), that pair is dominant in coupling. In other words, the signal from that pair (the first signal tap conductor 102 and the target trace 122) is stronger than the signal between the second signal tap conductor 124 and the second target trace 129. The crosstalk coupling of the other, opposite trace (the target trace 129 in the example of FIG. 6) can be measured or calculated, and—assuming symmetry—removed from the measurement using for example MIMO (multiple-input and multiple-output) correction factors. The example probe coupler 500 illustrated in FIGS. 5 and 6 is structured to couple to target traces of a DUT in a ground-signal-signal-ground (GSSG) configuration, but other embodiments may be structured to couple to target traces in a signal-ground-ground-signal (SGGS) configuration, a ground-signal-ground-signal-ground (GSGSG) configuration, or other configurations.

Figure 7:
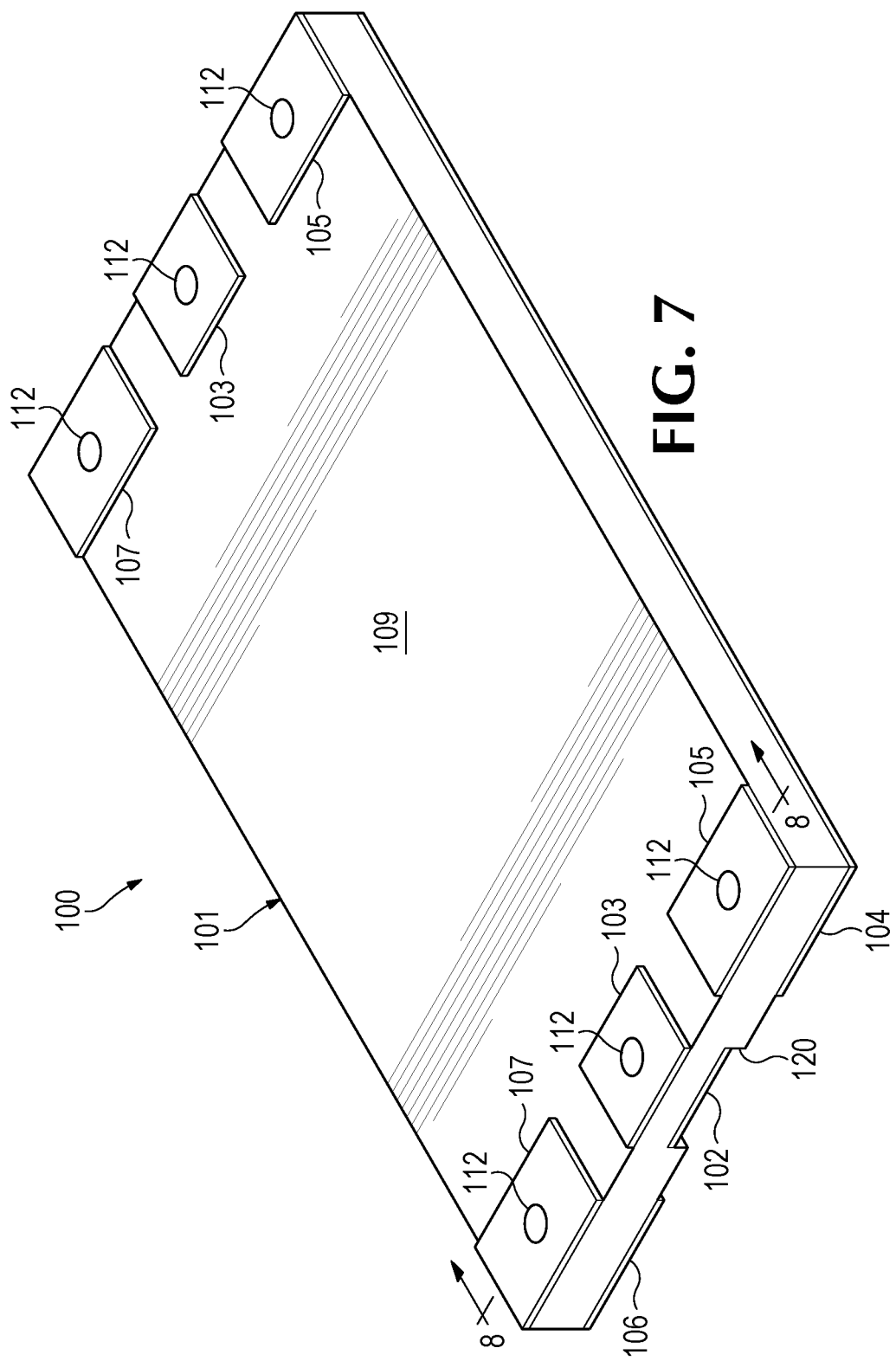
FIG. 7 is an isometric view showing portions of a top- or probe-side of a test and measurement probe coupler, according to embodiments.
Figure 8:
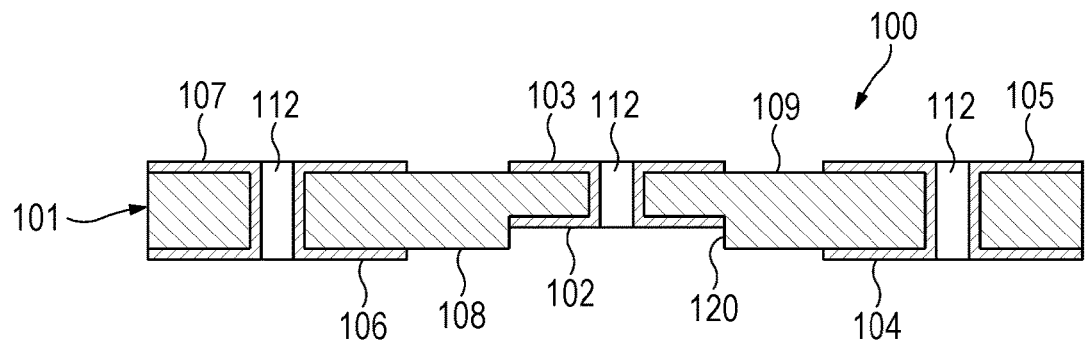
FIG. 8 is a cross-sectional view taken along the line indicated in FIG. 7.

FIG. 7 is an isometric view showing portions of a top- or probe-side of a test and measurement probe coupler, according to embodiments. FIG. 8 is a cross-sectional view taken along the line indicated in FIG. 7. While illustrated for the probe coupler 100 of FIGS. 1-3, this discussion of FIGS. 7 and 8 applies equally to the probe coupler 500 of FIGS. 5-6. Specifically, in addition to or in place of the endcaps 111, 116, 119 shown in FIGS. 1-6, the substrate 101 may include one or more vias 112. The vias 112 may extend through the substrate 101 and electrically couple one or more of the first signal tap conductor 102, the first ground tap conductor 104, and the second ground tap conductor 106 to the respective first signal contact 103, first ground contact 105, and second ground contact 107.

While FIGS. 7 and 8 illustrate an embodiment having one signal tap conductor, embodiments having an additional signal tap conductor, such as the second signal tap conductor 124 illustrated in FIGS. 5 and 6, may likewise have one or more vias 112 extending through the substrate 101 and electrically coupling the second signal tap conductor 124 to the second signal contact 125.

In embodiments, the probe coupler 100 of FIGS. 1-3 and the probe coupler 500 of FIGS. 5-6 may be configured to be contacted (or probed) by a probe device or may be part of the probe device itself.

Figure 9:
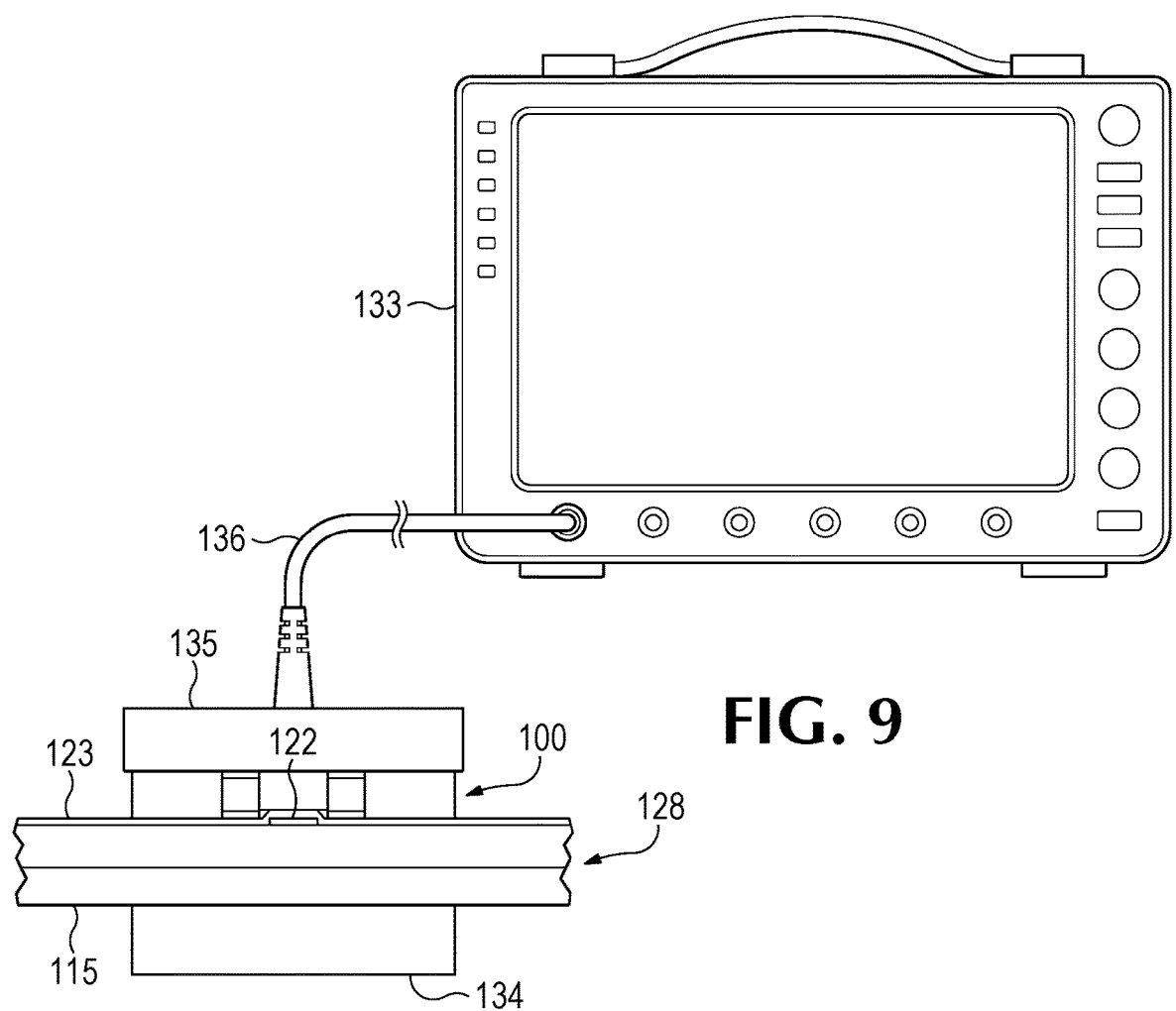
FIG. 9 illustrates an example test and measurement probe coupler connected to an example test and measurement system.

FIG. 9 shows an example probe coupler 100 connected to an example test and measurement instrument 133. The probe coupler 100 is depicted from an end of the probe coupler 100. As illustrated in FIG. 9, the probe coupler 100 may be joined to the DUT 128 by, for example, a magnetic clamp 134. The probe coupler 100 may also be joined to the test and measurement instrument 133 by, for example, a connector 135 and cable 136. Although FIG. 9 depicts the probe coupler 100 of FIGS. 1-3, the probe coupler 500 of FIGS. 5-6 could likewise be connected to a test and measurement instrument 133.

Figure 10:
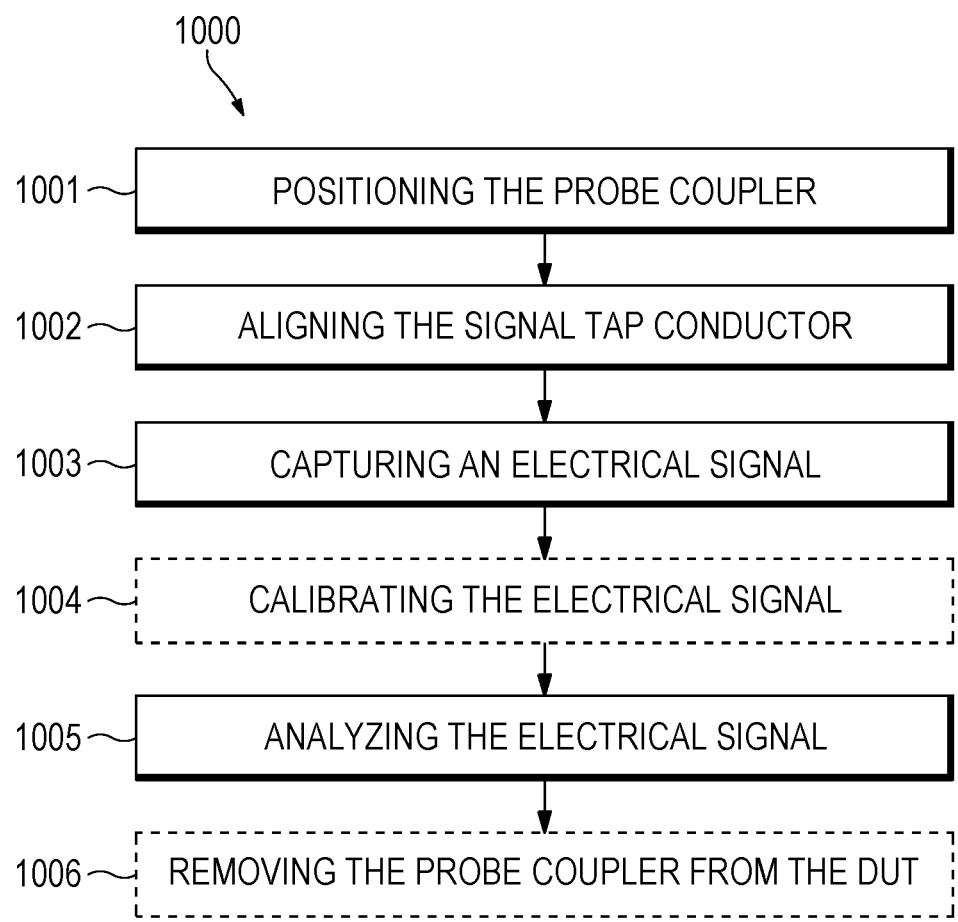
FIG. 10 shows an example method of using a test and measurement probe coupler, according to embodiments.

FIG. 10 shows an example method of using a test and measurement probe coupler 100, 500 according to embodiments. As illustrated in FIG. 10, a method 1000 of using the probe coupler 100, 500 may include: positioning 1001 the probe coupler 100, 500 in contact with a device under test (DUT); aligning 1002 the first signal tap conductor 102 of the probe coupler 100, 500 to be substantially parallel to a target trace 122 of the DUT; capturing 1003, by a test and measurement system, an electrical signal from the first signal tap conductor 102; and analyzing 1005, by the test and measurement system, the electrical signal from the first signal tap conductor 102 to infer an electrical property of an electrical signal in the target trace 122 of the DUT. The electrical property may be, for example, one or more of a voltage, a current, a frequency, or an energy of the electrical signal.

When the first signal tap conductor 102 is aligned to be substantially parallel to the target trace 122, the first signal tap conductor 102 may not be contacting the target trace 122. This is because, for example, the target trace 122 may be coated with solder mask 123 or a similar coating, or it may be because there is a gap between the target trace 122 and the first signal tap conductor 102.

The operation of capturing 1003 the electrical signal from the first signal tap conductor 102 may include touching a test and measurement probe to one or more contacts of the probe coupler 100, 500. The contacts may be, for example, the first signal contact 103, the second signal contact 125, the first ground contact 105, and the second ground contact 107 discussed above for FIGS. 1-7.

The method may also include removing 1006 the probe coupler 100, 500 from the DUT after the capturing 1003 the electrical signal from the first signal tap conductor 102. That is, the probe coupler 100, 500 may be removed from the DUT without damaging the DUT, rendering the DUT inoperable, or leaving part of the probe coupler 100, 500 behind on the DUT.

The method may also include calibrating 1004 the electrical signal from the first signal tap conductor 102 to the electrical property of the electrical signal in the target trace 122 of the DUT. The calibrating 1004 may be by, for example, using one or more of the following techniques:

(a) Electromagnetic Simulation of DUT-Probe pair: Simulate the probe coupler and the target trace of the DUT using knowledge of the material properties and a 3D or 2.5D electromagnetic field solver.

(b) Partial measurement of DUT-Probe pair: Infer the coupling through time or frequency domain measurements of the through path and reflection paths of the probe coupler, both with and without the probe coupler being installed on a DUT. Since the circuit is linear, reflectometry techniques can be used to determine the energy propagated along the trace versus coupled to the DUT trace, and positional/relative impedance measurement techniques can establish the self- and mutual-capacitances and inductances of the coupler section. The boundary conditions of the dimensions and materials of the coupler can be used to solve the problem analytically.

(c) Measurement transference to DUT-Probe pair: Use a calibration fixture which is materially and dimensionally the same as the DUT. Apply test signals to the calibration circuit board, and the instrument measures the results and applies correction factors to the measurements. Then, the probe is transferred to the DUT and the measurements are repeated.

Other calibrating techniques may also be used. Additionally, the calibration operation 1004 illustrated in FIG. 10 need not be performed every time an electrical signal is captured in operation 1003. Rather, the operation 1004 may be performed a single time or periodically during a series of signal captures.

The operation of analyzing 1005 the electrical signal may include correlating the electrical signal from the first signal tap conductor 102 to the electrical property of the electrical signal in the target trace 122 of the DUT. The correlating may be, for example, using the calibrating techniques discussed above.

With reference to FIGS. 1-3, the probe coupler 100, 500 of the method 1000 may include a substrate 101 having a first side 108 and a second side 109 opposite the first side 108, a first signal tap conductor 102 extending a first length 110 along the first side 108 of the substrate 101, and a first ground tap conductor 104 extending a second length 113 along the first side 108 of the substrate 101, the first ground tap conductor 104 being substantially parallel to the first signal tap conductor 102 and disposed in a first lateral direction 114 away from the first signal tap conductor 102. Each of these may be as described above.

The probe coupler 100, 500 of the method 1000 may also include a second ground tap conductor 106 extending a third length 117 along the first side 108 of the substrate 101, the second ground tap conductor 106 being substantially parallel to the first signal tap conductor 102 and to a second lateral direction 118 of the first signal tap conductor 102, the second lateral direction 118 of the first signal tap conductor 102 being opposite the first lateral direction 114 of the first signal tap conductor 102. Each of these may be as described above.

The probe coupler 500 of the method 1000 may also include a second signal tap conductor 124 extending a fourth length 126 along the first side 108 of the substrate 101, the second signal tap conductor 124 being substantially parallel to the first signal tap conductor 102 and between the first signal tap conductor 102 and the first ground tap conductor 104. Each of these may be as described above. In such embodiments, the method 1000 may further include aligning the second signal tap conductor 124 of the probe coupler 500 to be substantially parallel to a second target trace 122 of the DUT; capturing, by the test and measurement system, an electrical signal from the second signal tap conductor 124; and analyzing, by the test and measurement system, the electrical signal from the second signal tap conductor 124 to infer an electrical property of an electrical signal in the second target trace 122 of the DUT. As explained above for the first signal tap conductor 102, the second signal tap conductor 124 may not be contacting the second target trace 122.

As noted above, each of the first signal tap conductor 102 and the second signal tap conductor 124 may be coated with an insulative or partially conductive film. If, for example, the user desires to pick up low frequencies of the electrical signal in the target trace 122 of the DUT, the film can be made to be moderately conductive such that the film passes direct current (DC) and low frequency (LF) components of the electrical signal in order to provide a DC/LF signal path. Alternatively, a second (split) signal path can be used to pick up the low frequencies.

Accordingly, embodiments of the disclosed technology enable signals to be captured from a printed circuit board (PCB), a hybrid integrated circuit, or a similar structure without physically contacting or breaking the signal path by providing a probe coupler that can be used as half of a directional coupler. The target trace in the DUT is functionally the other half. In this way, embodiments of the disclosed technology may be added to a DUT to capture the desired signals and then removed from the DUT, without damaging the DUT or leaving part of the probe coupler behind on the DUT. The probe coupler may then be readily applied to another target trace on the DUT to examine another signal.

EXAMPLES

Illustrative examples of the disclosed technologies are provided below. An embodiment of the technologies may include one or more, and any combination of, the examples described below.

Example 1 includes a test and measurement probe coupler comprising: a substrate; a first signal tap conductor extending a first length along the substrate; a first signal contact electrically coupled to the first signal tap conductor; a first ground tap conductor extending a second length along the substrate, the first ground tap conductor being substantially parallel to the first signal tap conductor, and the first ground tap conductor being disposed in a first lateral direction away from the first signal tap conductor; and a first ground contact electrically coupled to the first ground tap conductor.

Example 2 includes the probe coupler of Example 1, in which the substrate includes a channel, the first length of the first signal tap conductor being within the channel.

Example 3 includes the probe coupler of any of Examples 1-2, in which the first signal tap conductor extends around an edge of the substrate to physically connect to the first signal contact.

Example 4 includes the probe coupler of any of Examples 1-3, further comprising a via extending through the substrate and electrically coupling the first signal tap conductor to the first signal contact.

Example 5 includes the probe coupler of any of Examples 1-4, in which the first ground tap conductor extends around an edge of the substrate to physically connect to the first ground contact.

Example 6 includes the probe coupler of any of Examples 1-5, further comprising a via extending through the substrate and electrically coupling the first ground tap conductor to the first ground contact.

Example 7 includes the probe coupler of any of Examples 1-6, further comprising: a second ground tap conductor extending a third length along the substrate, the second ground tap conductor being substantially parallel to the first signal tap conductor, and the second ground tap conductor being disposed in a second lateral direction away from the first signal tap conductor, the second lateral direction of the first signal tap conductor being opposite the first lateral direction of the first signal tap conductor; and a second ground contact electrically coupled to the second ground tap conductor.

Example 8 includes the probe coupler of Example 7, in which the second ground tap conductor extends around an edge of the substrate to physically connect to the second ground contact.

Example 9 includes the probe coupler of any of Examples 7-8, further comprising a via extending through the substrate and electrically coupling the second ground tap conductor to the second ground contact.

Example 10 includes the probe coupler of any of Examples 1-9, further comprising: a second signal tap conductor extending a fourth length along the substrate, the second signal tap conductor being substantially parallel to the first signal tap conductor and between the first signal tap conductor and the first ground tap conductor; and a second signal contact electrically coupled to the second signal tap conductor.

Example 11 includes the probe coupler of Example 10, in which the second signal tap conductor extends around an edge of the substrate to physically connect to the second signal contact.

Example 12 includes the probe coupler of any of Examples 10-11, further comprising a via extending through the substrate and electrically coupling the second signal tap conductor to the second signal contact.

Example 13 includes the probe coupler of any of Examples 10-12, further comprising: a second ground tap conductor extending a third length along the substrate, the second ground tap conductor being substantially parallel to the first signal tap conductor, and the second ground tap conductor being disposed in a second lateral direction away from the first signal tap conductor, the second lateral direction of the first signal tap conductor being opposite the first lateral direction of the first signal tap conductor; and a second ground contact electrically coupled to the second ground tap conductor.

Example 14 includes a method of using a test and measurement probe coupler, the method comprising: positioning the probe coupler in contact with a device under test (DUT), the probe coupler comprising: a substrate, a first signal tap conductor extending a first length along the substrate, and a first ground tap conductor extending a second length along the substrate, the first ground tap conductor being substantially parallel to the first signal tap conductor and disposed in a first lateral direction away from the first signal tap conductor; aligning the first signal tap conductor of the probe coupler to be substantially parallel to a portion of a target trace of the DUT; and capturing, by a test and measurement system, an electrical signal from the first signal tap conductor.

Example 15 includes the method of Example 14, in which the capturing the electrical signal from the first signal tap conductor comprises touching a test and measurement probe to a contact of the probe coupler.

Example 16 includes the method of any of Examples 14-15, in which the first signal tap conductor is not touching the target trace of the DUT.

Example 17 includes the method of any of Examples 14-16, further comprising analyzing, by the test and measurement system, the electrical signal from the first signal tap conductor to infer an electrical property of an electrical signal in the target trace of the DUT.

Example 18 includes the method of Example 17, in which the analyzing the electrical signal includes correlating the electrical signal from the first signal tap conductor to the electrical property of the electrical signal in the target trace of the DUT.

Example 19 includes the method of any of Examples 14-18, in which the first signal tap conductor is covered with a partially conductive film that is touching the target trace of the DUT and that provides a low frequency signal path for the electrical signal in the target trace of the DUT.

Example 20 includes the method of any of Examples 14-19, in which the probe coupler further comprises a second signal tap conductor extending a fourth length along the substrate, the second signal tap conductor being substantially parallel to the first signal tap conductor and between the first signal tap conductor and the first ground tap conductor, the method further comprising: aligning the second signal tap conductor of the probe coupler to be substantially parallel to a portion of a second target trace of the DUT, the second signal tap conductor not contacting the second target trace; capturing, by a test and measurement system, an electrical signal from the second signal tap conductor; and analyzing, by the test and measurement system, the electrical signal from the second signal tap conductor to infer an electrical property of an electrical signal in the second target trace of the DUT.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Also, directions such as "left," "right," "top," and "bottom" are used for convenience and in reference to the views provided in figures. But the disclosed technology may have a number of orientations in actual use. Thus, a feature that is on top or on the bottom in the figures may not have that same orientation or direction in actual use.

Although specific embodiments have been illustrated and described for purposes of illustration, it will be understood that various modifications may be made without departing from the spirit and scope of the disclosure. Accordingly, the invention should not be limited except as by the appended claims.

The invention claimed is:

1. A test and measurement probe coupler comprising:
   a substrate;
   a first signal tap conductor extending a first length along the surface of a first side of the substrate;
   a first signal contact disposed on the substrate and electrically coupled to the first signal tap conductor;
   a first ground tap conductor extending a second length along the surface of the first side of the substrate, the first ground tap conductor being substantially parallel to the first signal tap conductor, and the first ground tap conductor being disposed in a first lateral direction away from the first signal tap conductor; and
   a first ground contact disposed on the the substrate and electrically coupled to the first ground tap conductor, wherein the probe coupler is structured to form a first portion of a directional coupler when the probe coupler is placed near a portion of a target trace on a device under test, the first signal tap conductor not touching the target trace, and the target trace forms a second portion of the directional coupler.

2. The probe coupler of claim 1, in which the substrate includes a channel, the first length of the first signal tap conductor being within the channel.

3. The probe coupler of claim 1, in which the first signal contact is disposed on a second side of the substrate opposite the first side, and the first signal tap conductor extends around an edge of the substrate to physically connect to the first signal contact.

4. The probe coupler of claim 1, in which the first signal contact is disposed on a second side of the substrate opposite the first side, further comprising a via extending through the substrate and electrically coupling the first signal tap conductor to the first signal contact.

5. The probe coupler of claim 1, in which the first signal contact is disposed on a second side of the substrate opposite the first side, and the first ground tap conductor extends around an edge of the substrate to physically connect to the first ground contact.

6. The probe coupler of claim 1, in which the first signal contact is disposed on a second side of the substrate opposite the first side, further comprising a via extending through the substrate and electrically coupling the first ground tap conductor to the first ground contact.

7. The probe coupler of claim 1, further comprising:
   a second ground tap conductor extending a third length along the surface of the first side of the substrate, the second ground tap conductor being substantially parallel to the first signal tap conductor, and the second ground tap conductor being disposed in a second lateral direction away from the first signal tap conductor, the second lateral direction of the first signal tap conductor being opposite the first lateral direction of the first signal tap conductor; and
   a second ground contact disposed on the substrate and electrically coupled to the second ground tap conductor.

8. The probe coupler of claim 7, in which the second ground contact is disposed on a second side of the substrate opposite the first side, and the second ground tap conductor extends around an edge of the substrate to physically connect to the second ground contact.

9. The probe coupler of claim 7, in which the second ground contact is disposed on a second side of the substrate opposite the first side, further comprising a via extending through the substrate and electrically coupling the second ground tap conductor to the second ground contact.

10. The probe coupler of claim 1, further comprising:
    a second signal tap conductor extending a fourth length along the surface of the first side of the substrate, the second signal tap conductor being substantially parallel to the first signal tap conductor and between the first signal tap conductor and the first ground tap conductor; and
    a second signal contact disposed on the substrate and electrically coupled to the second signal tap conductor.

11. The probe coupler of claim 10, in which the second signal contract is disposed on a second side of the substrate opposite the first side, and the second signal tap conductor extends around an edge of the substrate to physically connect to the second signal contact.

12. The probe coupler of claim 10, in which the second signal contract is disposed on a second side of the substrate opposite the first side, further comprising a via extending through the substrate and electrically coupling the second signal tap conductor to the second signal contact.

13. The probe coupler of claim 10, further comprising:
a second ground tap conductor extending a third length along the surface of the first side of the substrate, the second ground tap conductor being substantially parallel to the first signal tap conductor, and the second ground tap conductor being disposed in a second lateral direction away from the first signal tap conductor, the second lateral direction of the first signal tap conductor being opposite the first lateral direction of the first signal tap conductor; and
a second ground contact disposed on the substrate and electrically coupled to the second ground tap conductor.

14. A method of using a test and measurement probe coupler, the method comprising:
positioning the probe coupler in proximity with a device under test (DUT), the probe coupler comprising:
a substrate,
a first signal tap conductor extending a first length along the surface of a first side of the substrate,
a first signal contact disposed on the substrate and electrically coupled to the first signal tap conductor,
a first ground tap conductor extending a second length along the surface of the first side of the substrate, the first ground tap conductor being substantially parallel to the first signal tap conductor and disposed in a first lateral direction away from the first signal tap conductor, and
a first ground contact disposed on the substrate and electrically coupled to the first ground tap conductor;
aligning the first signal tap conductor of the probe coupler to be substantially parallel to a portion of a target trace of the DUT, thereby establishing high frequency contactless coupling between the first signal tap conductor and the portion of the target trace of the DUT; and
capturing, by a test and measurement system, an electrical signal from the first signal contact.

15. The method of claim 14, in which the capturing the electrical signal from the first signal contact comprises touching a test and measurement probe to the first signal contact of the probe coupler.

16. The method of claim 14, in which aligning the first signal tap conductor of the probe coupler to be substantially parallel to a portion of the target trace of the DUT causes the probe coupler and the target trace to form a directional coupler.

17. The method of claim 14, further comprising analyzing, by the test and measurement system, the electrical signal from the first signal contact to infer an electrical property of an electrical signal in the target trace of the DUT.

18. The method of claim 17, in which the analyzing the electrical signal includes correlating the electrical signal from the first signal contact to the electrical property of the electrical signal in the target trace of the DUT.

19. The method of claim 14, in which the first signal tap conductor is covered with a partially conductive film that is touching the target trace of the DUT and that provides a low frequency signal path for the electrical signal in the target trace of the DUT.

20. The method of claim 14, in which the probe coupler further comprises a second signal tap conductor extending a fourth length along the surface of the first side of the substrate, the second signal tap conductor being substantially parallel to the first signal tap conductor and between the first signal tap conductor and the first ground tap conductor, and a second signal contact disposed on the substrate and electrically coupled to the second signal tap conductor, the method further comprising:
aligning the second signal tap conductor of the probe coupler to be substantially parallel to a portion of a second target trace of the DUT, thereby establishing high frequency contactless coupling between the second signal tap conductor and the portion of the second target trace of the DUT;
capturing, by a test and measurement system, an electrical signal from the second signal contact; and
analyzing, by the test and measurement system, the electrical signal from the second signal contact to infer an electrical property of an electrical signal in the second target trace of the DUT.

* * * * *